(12) United States Patent
Goodman et al.

(10) Patent No.: US 8,204,148 B2
(45) Date of Patent: Jun. 19, 2012

(54) SPACE-TIME DIGITAL POWER AMPLIFIER

(75) Inventors: Joel Irwin Goodman, Chelmsford, MA (US); Helen Haeran Kim, Sudbury, MA (US); Benjamin Andrew Miller, Cambridge, MA (US); James Edwin Vian, Westford, MA (US)

(73) Assignee: Massachusetts Institute of Technology, Cambridge, MA (US)

( * ) Notice: Subject to any disclaimer, the term of this patent is extended or adjusted under 35 U.S.C. 154(b) by 329 days.

(21) Appl. No.: 12/687,521

(22) Filed: Jan. 14, 2010

(65) Prior Publication Data

US 2011/0170624 A1    Jul. 14, 2011

(51) Int. Cl.
*H04K 1/02*    (2006.01)
(52) U.S. Cl. ........ 375/297; 375/260; 375/267; 375/295; 375/299; 455/101; 455/114.3; 455/127.1; 455/127.2; 455/127.3; 455/132; 455/500; 455/562.1; 370/334; 341/173; 341/180
(58) Field of Classification Search .................. 375/260, 375/267, 295, 297, 299; 455/101, 114.3, 455/127.1, 127.2, 127.3, 132, 500, 562.1; 370/334; 341/173, 180
See application file for complete search history.

(56) References Cited

U.S. PATENT DOCUMENTS 7,852,970 B2 * 12/2010 Rofougaran .................. 375/302

OTHER PUBLICATIONS

Staszewski, Robert Bogdan et al.; "All-Digital PLL and Transmitter for Mobile Phones"; IEEE Journal of Solid-State Circuits, vol. 40, No. 12; Dec. 2005; pp. 2469-2482.
Kulka, Zbigniew; "Application of Pulse Modulation Techniques for Class-D Audio Power Amplifiers"; Archives of Acoustics; 2007; vol. 32, No. 3; pp. 683-706.
Jensen, Jorgen Arendt; "A New Principle for an All-Digital Preamplifier and Equalizer"; J. Audio Eng. Soc., vol. 35, No. 12; Dec. 1987; pp. 994-1003.
Vassilakis, Bill et al.; Comparative Analysis of GaAs/LDMOS/GaN High Power Transistors in a Digital Predistortion Amplifier System; IEEE Asia Pacific Microwave Conference Dec. 2005; vol. 2, 4 pgs.
Dutra, John A.; "Digital Amplifiers for Analog Power"; IEEE Transactions on Consumer Electronics, vol. CE-24, No. 3, Aug. 1978; pp. 308-317.
Hur, Joonhoi et al.; "Highly Efficient and Linear Level Shifting Digital LINC Transmitter with a Phase Offset Cancellation"; 2009 IEEE Radio and Wireless Symposium, Proceedings; pp. 211-214.
Jung, Nam-Sung et al.; "A New High-Efficiency and Super-Fidelity Analog Audio Amplifier with the aid of Digital Switching Amplifier: Class K Amplifier"; PESC 98 Record, 29th Annual IEEE Power Electronics Specialists Conference, 1998, vol. 1, pp. 457-463.
Kubo, Tokuro et al.; "A Highly Efficient Adaptive Digital Predistortion Amplifier for IMT-2000 Base Stations"; 57th IEEE Semiannual Vehicular Technology Conference, 2003, vol. 4, pp. 2206-2210.

* cited by examiner

*Primary Examiner* — Leon Flores
(74) *Attorney, Agent, or Firm* — Guerin & Rodriguez, LLP; William G. Guerin

(57) ABSTRACT

Described is a space-time digital power amplifier that can be used to generate an arbitrary waveform for a carrier signal. The space-time digital power amplifier employs temporal modulation of transmit signals generated by an array of transmitter modules. The RF signals transmitted from the array are spatially combined through free space propagation to generate the desired waveform. Advantageously, no digital-to-analog conversion is required and upconversion is unnecessary. The digital power amplifiers for the transmitter modules can be combined in a single chip package. The space-time digital power amplifier enables high power efficiency to be realized using pulse-shaped waveforms thus eliminating any need for the power amplifiers to operate over a wider bandwidth with a spectrally unconfined waveform.

10 Claims, 4 Drawing Sheets

64 –QAM CONSTELLATION

SPACE-TIME DIGITAL POWER AMPLIFIER

GOVERNMENT RIGHTS IN THE INVENTION

This invention was made with U.S. Government support under Contract No. FA8721-05-C-0002, awarded by the United States Air Force. The government may have certain rights in the invention.

FIELD OF THE INVENTION

The present invention relates generally to power amplification for communications waveforms. More particularly, the invention relates to a space-time digital power amplifier having highly efficient power utilization for transmission of an arbitrary waveform.

BACKGROUND OF THE INVENTION

Communication systems that transmit signals modulated according to various techniques, such as pulse shaped M-ary phase shift keying (PSK), M-ary quadrature amplitude modulation (QAM) and orthogonal frequency-division multiplexing (OFDM), typically have a peak-to-average power ratio (PAPR) that ranges from 8 dB to 12 dB. Consequently, these systems are not capable of efficient operation of their transmitter power amplifiers. For example, Class-C, Class-E and Class-F amplifier operate efficiently when biased near saturation; however, high PAPR values preclude such operation.

Pulse shaping can be eliminated to overcome the problem of a high PAPR; however, the communications waveform is spectrally unconfined and the power amplifier may be required to operate with more than five times the bandwidth of a spectrally confined waveform. For this reason, Class-A or Class-AB power amplifiers are often used in communications systems with the amplifiers significantly backed off from saturation.

SUMMARY OF THE INVENTION

In one aspect, the invention features a space-time digital power amplifier having an array of transmitter modules. Each transmitter module includes a digital power amplifier, a transmit antenna and a control circuit. The digital power amplifier has an input and an output, and is configured to generate a signal having an amplification at the output in response to an active state of a digital amplifier control signal. The transmit antenna is in communication with the output of the digital power amplifier and is configured to transmit an RF signal responsive to the signal at the output of the digital power amplifier. The control circuit has an output in communication with the input of the digital power amplifier and is configured to receive a digital phase control signal, a carrier signal and a phase-shifted carrier signal. The control circuit provides one of the carrier signal and the phase-shifted carrier signal to the input of the digital power amplifier in response to a state of the digital phase control signal. The carrier signal and the phase-shifted carrier signal are in-phase carrier signals for a first subset of the transmitter modules and are quadrature carrier signals for a second subset of the transmitter modules. The RF signals propagating from the antenna elements are spatially-combined to generate a communications signal having a waveform responsive to the digital amplifier control signals and the digital phase control signals.

In another aspect, the invention features a method for synthesizing a transmit signal comprising a carrier signal having a waveform. An amplitude and one of a first phase and a second phase are determined for an in-phase carrier signal based on a waveform for a signal to be transmitted. An amplitude and one of the first phase and the second phase are determined for a quadrature carrier signal based on the waveform for the signal to be transmitted. A plurality of in-phase carrier signals, each having a selected amplitude from a plurality of selectable amplitudes and a selected one of the first phase and the second phase, is transmitted from a first plurality of transmit antennas in an array of transmit antennas so that a spatial combination of the transmitted in-phase carrier signals has the determined amplitude and phase of the in-phase carrier signal. A plurality of quadrature carrier signals, each having a selected amplitude from a plurality of selectable amplitudes and a selected one of the first phase and the second phase, is transmitted from a second plurality of transmit antennas in the array of transmit antennas so that a spatial combination of the transmitted quadrature carrier signals has the determined amplitude and phase of the quadrature carrier signal.

In still another aspect, the invention features a space-time digital power amplifier having an array of transmitter modules. Each transmitter module includes a digital power amplifier, a transmit antenna and a control circuit. The digital power amplifier has a first input, a second input and an output, and is configured to generate a signal having an amplification at the output in response to an active state of a digital amplifier control signal received at the first input. The transmit antenna is in communication with the output of the digital power amplifier and is configured to transmit an RF signal responsive to the signal at the output of the digital power amplifier. The control circuit has a first output in communication with the first input of the digital power amplifier and a second output in communication with the second input of the digital power amplifier. The control circuit is configured to receive a digital phase control signal, a carrier signal and a phase-shifted carrier signal. The control circuit provides one of the carrier signal and the phase-shifted carrier signal to the second input of the digital power amplifier in response to a state of the digital phase control signal. The carrier signal and the phase-shifted carrier signal are in-phase carrier signals for a first subset of the transmitter modules and are quadrature carrier signals for a second subset of the transmitter modules. The amplification of the signal at the output of the digital power amplifier is responsive to the digital amplifier control signal received at the first input of the digital power amplifier. The RF signals propagating from the antenna elements are spatially-combined to generate a communications signal having a waveform responsive to the digital amplifier control signals and the digital phase control signals.

BRIEF DESCRIPTION OF THE DRAWINGS

The above and further advantages of this invention may be better understood by referring to the following description in conjunction with the accompanying drawings, in which like numerals indicate like structural elements and features in the various figures. For clarity, not every element may be labeled in every figure. The drawings are not necessarily to scale, emphasis instead being placed upon illustrating the principles of the invention.

DETAILED DESCRIPTION

The invention relates to a space-time digital power amplifier that can be used to generate an arbitrary waveform for a carrier signal. The space-time digital power amplifier employs temporal modulation of transmit signals generated by an array of transmitter modules. The RF signals transmitted from the array are spatially combined (e.g., in free space propagation) to generate the desired waveform. Advantageously, no digital-to-analog conversion (DAC) is required and upconversion is unnecessary. In addition, the digital power amplifiers for the transmitter modules can be combined in a single chip package. The space-time digital power amplifier enables high power efficiency to be realized using pulse-shaped waveforms thus eliminating any need for the power amplifiers to operate over a wider bandwidth with a spectrally unconfined waveform.

Figure 1:
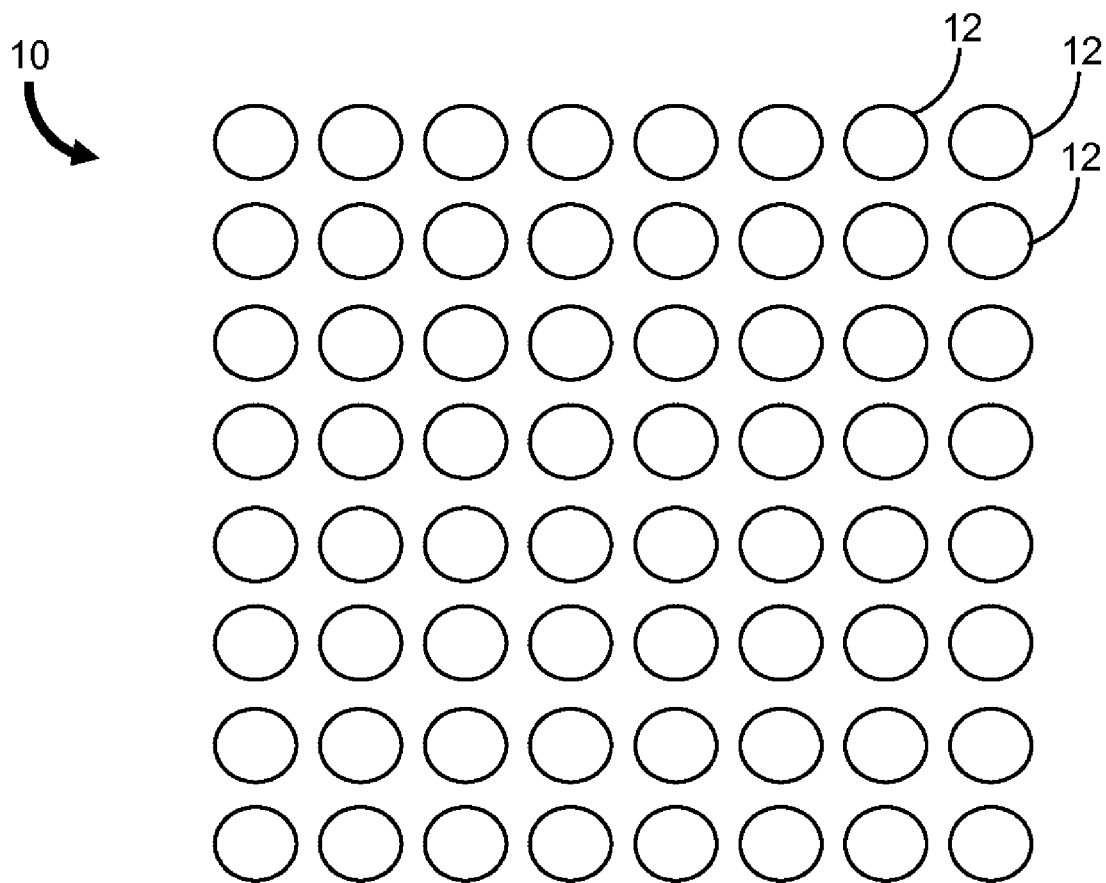
FIG. 1 shows an array of RF transmit antennas according to an embodiment of the invention.
Figure 2A:
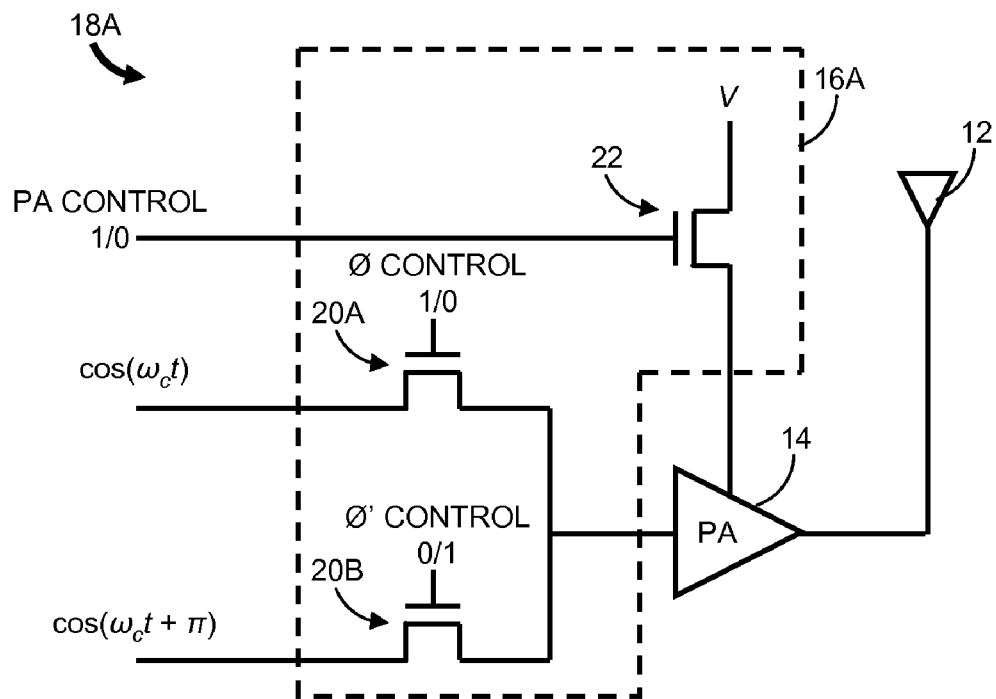
FIGS. 2A and 2B are individual transmitter modules used with in-phase and quadrature components, respectively, of a carrier signal according to an embodiment of the invention.

FIG. 1 shows an 8×8 array 10 of RF transmit antennas 12 according to an embodiment of the invention. Each one of 32 transmit antennas 12 is coupled to a digital power amplifier 14 that is operated according to a control circuit 16A as shown in FIG. 2A. Each of the other 32 transmit antennas 12 in the array 10 is coupled to a digital power amplifier 14 that is operated by a different control circuit 16B as shown in FIG. 2B.

Referring to FIG. 2A for a single transmitter module 18A, a pair of complementary switches 20A and 20B couples an in-phase component of a carrier signal $\cos(\omega_c t)$ at an angular frequency $\omega_c$ to the input of the digital power amplifier 14. If the first switch 20A is activated (i.e., closed) by a digital phase control signal Ø CONTROL, the second switch 20B is made inactive (i.e., opened) by a complementary digital phase control signal Ø' CONTROL. In this case, the in-phase carrier component is applied to the input of the digital power amplifier 14. Conversely, if the first switch 20A is inactive according to the digital phase control signal, the second switch 20B is active and a phase-shifted in-phase carrier component $\cos(\omega_c t + \pi)$ is applied to the input of the digital power amplifier 14. The output signal from the digital power amplifier 14 is received by the antenna element 12 which effectively filters the signal according to the antenna bandpass filtering.

The voltage V applied to the digital power amplifier 14 is controlled by a MOSFET switch 22 according to a single bit digital amplifier control signal PA CONTROL. The carrier signal ($\cos(\omega_c t)$ or $\cos(\omega_c t + \pi)$) is amplified by a factor proportional to V when the digital amplifier control signal is in an active state. Conversely, when the digital amplifier control signal is in an inactive state, the carrier signal is not present at the output of the digital power amplifier 14. The voltages V applied to the 64 digital power amplifiers 14 for the array 10 differ according to array location as described in more detail below. Consequently, the amplification of the carrier signal is dependent on array location.

Figure 2B:
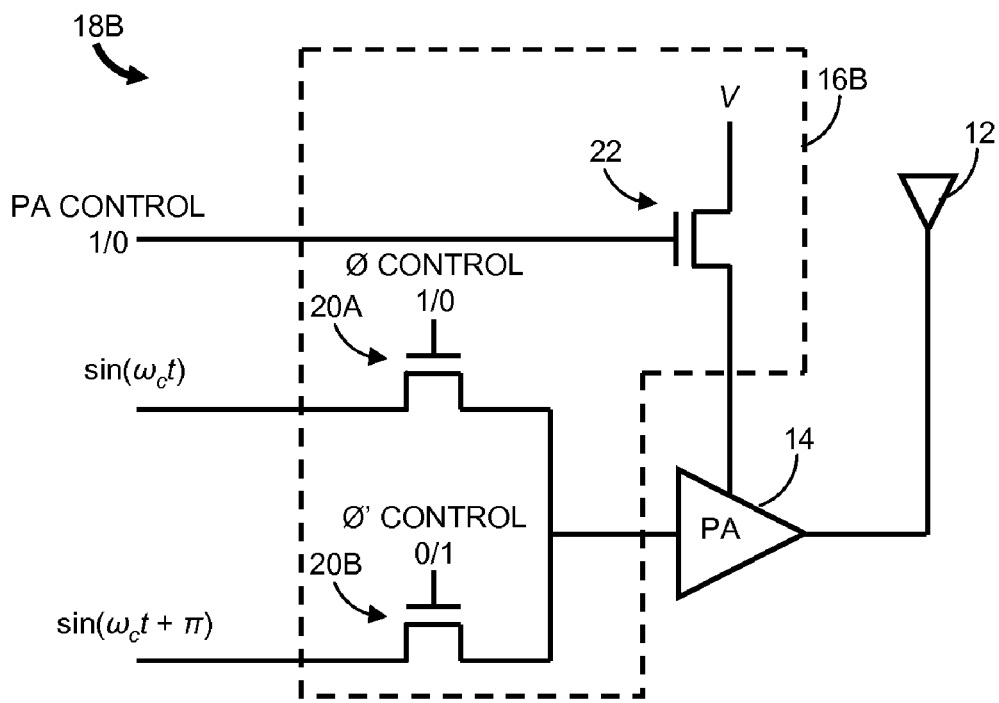

FIG. 2B shows one of the 32 transmitter modules 18B associated with each of the other 32 transmit antennas 12 in the array 10. The transmitter module 18B includes a digital power amplifier 14, a control circuit 16B and a transmit antenna 12. The module configuration is similar to that shown in FIG. 2A; however, either the quadrature component of the carrier signal $\sin(\omega_c t)$ or the phase-shifted quadrature component $\sin(\omega_c t + \pi)$ is applied to the digital power amplifier 14 according to the digital phase control signals Ø CONTROL and Ø' CONTROL.

Figure 3:
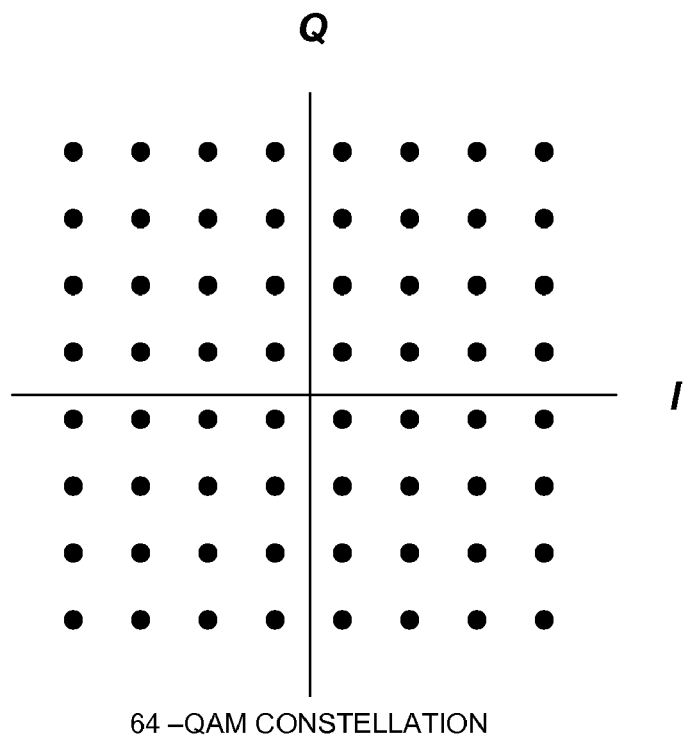
FIG. 3 graphically depicts a 64-QAM modulation that can be used with a transmitter system utilizing the space-time digital power amplifiers of the invention.
Figure 4:
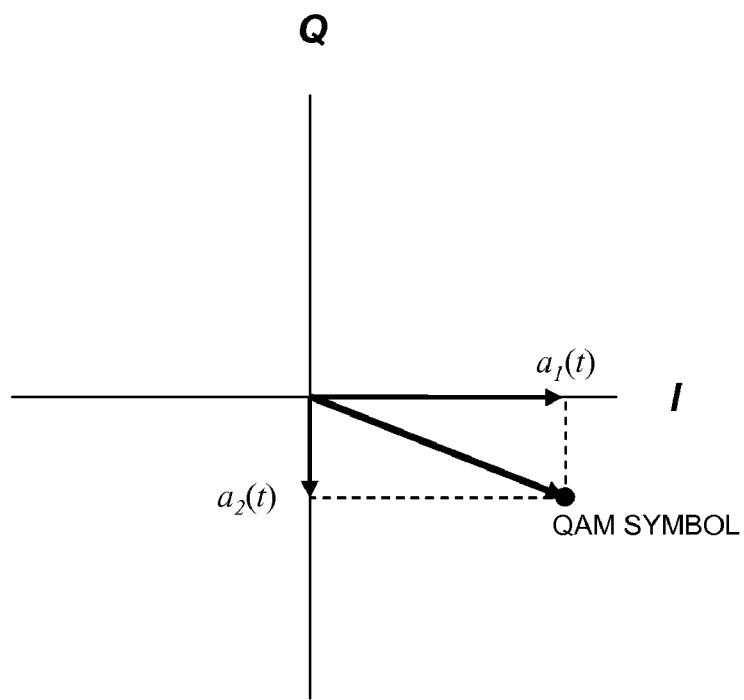
FIG. 4 is a graphical illustration of how in-phase magnitude and quadrature magnitude are related to a QAM symbol.

FIG. 3 graphically shows, by way of example, a 64-QAM modulation scheme that can be used with a transmitter system based on the space-time digital power amplifier of the invention. Each of the 64 symbol points represented on the in-phase (I) and quadrature (Q) axes has a unique combination of magnitude and phase. FIG. 4 is a graphical depiction of how the in-phase magnitude $a_1$ and quadrature magnitude $a_2$ relate to a single symbol in the QAM constellation.

The signal transmitted by the transmitter array 10 is determined by coherent addition of the signals transmitted from the 64 transmit antennas 12. More specifically, the signal S(t) transmitted from the array 10 is given by $$S(t) = a_1(t)\cos(\omega_c t) + a_2(t)\sin(\omega_c t).$$

where the values of $a_1(t)$ and $a_2(t)$ are determined by the transmit signals generated by the active in-phase array modules and active quadrature array modules, respectively.

In preferred embodiments, transmitter modules 18 are grouped to enable convenient generation of the carrier coefficients $a_1(t)$ and $a_2(t)$. A group is uniquely defined by a common amplification factor (i.e., "group amplification") and an in-phase or quadrature component (i.e., $\cos(\omega_c t)$ or $\sin(\omega_c t)$) common to each module 18 in the group. In addition, the phase of the carrier component is commonly controlled for each module 18 in the group. Each group has a transmit power level that is related to the transmit power levels of the other groups by powers of two.

Selective activation and deactivation of each group and the phase (i.e., 0 or $\pi$) for each group over time enables arbitrary waveform synthesis. The digital modulation rate of the switches 20 and 22 defines the band pass for the transmitter system subject to the band pass response of the transmitter antennas 12.

Table 1 shows how nine groups (I1 to I9) for the 32 in-phase array modules 18A are defined according to one embodiment. Nine groups (Q1 to Q9, not shown) are similarly defined for the 32 quadrature array modules 18B. Referring by way of example to group I1, eight elements operate with a common amplification such that the carrier amplitude at the output of each digital power amplifier 14 is A. Thus the group amplification is 8A.

In a preferred embodiment, the groups are defined so that the group amplitudes vary in a manner similar to that for quantization levels for a DAC as shown by the normalized amplifications. In effect, group I1 corresponds to a most significant amplitude bit while group I9 corresponds to a least significant amplitude bit. It should be noted that the group amplitude is negative for purposes of coherent addition with other group amplitudes if the amplified carrier component is phase-shifted by $\pi$.

TABLE 1

| GROUP | NUMBER OF ELEMENTS | ELEMENT AMPLIFICATION | GROUP AMPLIFICATION | NORMALIZED AMPLIFICATION |
|---|---|---|---|---|
| I1 | 8 | A | 8A | 256 |
| I2 | 4 | A | 4A | 128 |
| I3 | 2 | A | 2A | 64 |
| I4 | 1 | A | A | 32 |
| I5 | 2 | A/4 | A/2 | 16 |
| I6 | 8 | A/32 | A/4 | 8 |
| I7 | 4 | A/32 | A/8 | 4 |
| I8 | 2 | A/32 | A/16 | 2 |
| I9 | 1 | A/32 | A/32 | 1 |

Figure 5:
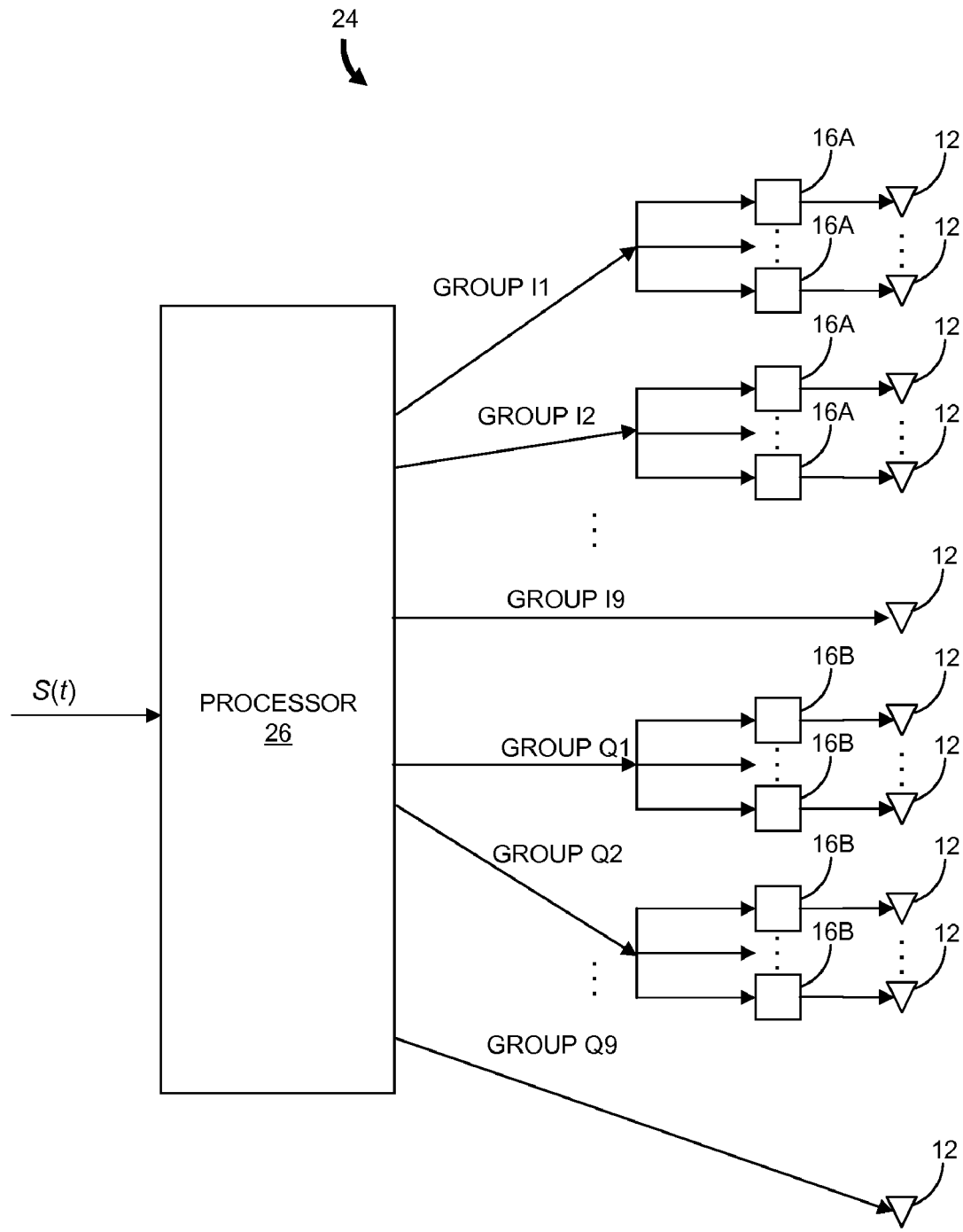
FIG. 5 is a block diagram of an embodiment of a transmitter system according to the invention.

FIG. 5 shows a transmitter system 24 according to a preferred embodiment of the invention. The system 24 includes a processor 26 that receives the baseband signal S(t) to be transmitted. The processor 26 provides the digital phase control signals and the digital amplifier control signal to the transmitter modules 16 for each group. RF signals propagating from the antennas 12 are combined in free space to generate a communications signal having a waveform based on the baseband signal S(t).

Table 2 lists four examples of how groups and phases are selected to achieve a desired waveform. The baseband representation is normalized to A as expressed in Table 1. The switches 20 and 22 are capable of operation at baseband modulation rates. For each of the four baseband entries, the corresponding active groups and their phases are shown for the in-phase and quadrature carrier signals. By way of a specific example, to generate the transmit signal S(t) for a −1.2+3.3j baseband value, amplified in-phase carrier signals with a π phase shift are transmitted from array antennas 12 belonging to in-phase groups 4, 7 and 8, and amplified quadrature carriers without a phase shift are transmitted from array antennas 12 belonging to quadrature groups 3, 4, 6 and 8.

TABLE 2

| BASEBAND | IN-PHASE (I GROUP NUMBER, PHASE) | QUADRATURE (Q GROUP NUMBER, PHASE) |
|---|---|---|
| 10.1 − 3.2j | (1, 0) (3, 0) (8, 0) (9, 0) | (3, π) (4, π) (7, π) (8, π) |
| −1.2 + 3.3j | (4, π) (7, π) (8, π) | (3, 0) (4, 0) (6, 0) (8, 0) |
| −5.0 − 3.3j | (2, π) (4, π) | (3, π) (4, π) (6, π) (8, π) |
| 2.6 + 3.6j | (3, 0) (5, 0) (8, 0) (9, 0) | (3, 0) (4, 0) (5, 0) (8, 0) (9, 0) |

The illustrated embodiment relates to an 8×8 array 10 with each array element belonging to only one of the nine in-phase groups and nine quadrature groups. The invention contemplates alternative numbers of array elements, group definitions and array shapes. For example, the numbers of elements and groups can be increased to increase the amplitude resolution of the transmit signal S(t). In addition, the number of power amplification factors used in the grouping can be different than those listed in Table 1.

In other embodiments, the configuration of the transmitter modules 18 shown in FIGS. 2A and 2B can be different. For example, the switches 22 used to apply a voltage to the digital power amplifiers 14 can be replaced by current switches so that the signals generated at the output of the digital power amplifiers 14 are current modulated signals.

The digital space-time digital power amplifier can be used to change the waveform of the pulses to be transmitted. In one embodiment, an initial waveform is modified to adapt the signal to be transmitted to a communication channel, for example, by limiting the effective bandwidth of the transmitted signal. This modification can reduce or eliminate intersymbol interference and other sources of signal degradation, especially for higher symbol rates and for narrow channel frequency separations.

Space-time modulation in accordance with the invention achieves multiple advantages over known modulation techniques. The digital space-time power amplifier is digitally controlled: single bit control signals are used to control the various switches in the device. Control circuitry can be implemented in a single integrated circuit. Power amplifiers for the transmitter modules operate near peak efficiency (e.g., Class E/F operation) and are only required to transmit in a narrow-band waveform relative to the bandwidth of the transmitted signal which includes the spatially-combined signal contributions from all transmitter modules. Thus the space-time digital power amplifier can operate over bandwidths that can be several times greater than the modulation bandwidth of the transmitted signal.

While the invention has been shown and described with reference to specific embodiments, it should be understood by those skilled in the art that various changes in form and detail may be made therein without departing from the spirit and scope of the invention.

What is claimed is:

1. A space-time digital power amplifier, comprising:
   an array of transmitter modules, each of the transmitter modules comprising:
      a digital power amplifier having an input and an output, and configured for generating a signal having an amplification at the output in response to an active state of a digital amplifier control signal;
      a transmit antenna in communication with the output of the digital power amplifier and configured to transmit an RF signal responsive to the signal at the output of the digital power amplifier; and
      a control circuit having an output in communication with the input of the digital power amplifier, the control circuit configured to receive a digital phase control signal, a carrier signal and a phase-shifted carrier signal, the control circuit providing one of the carrier signal and the phase-shifted carrier signal to the input of the digital power amplifier in response to a state of the digital phase control signal, wherein the carrier signal and the phase-shifted carrier signal are in-phase carrier signals for a first subset of the transmitter modules and are quadrature carrier signals for a second subset of the transmitter modules,
   wherein the RF signals propagating from the transmit antennas are spatially-combined to generate a communications signal having a waveform responsive to the digital amplifier control signals and the digital phase control signals.

2. The space-time digital power amplifier of claim 1 wherein the phase-shifted carrier signal differs in phase from the carrier signal by $\pi$ radians.

3. The space-time digital power amplifier of claim 1 wherein the control circuit comprises a pair of switches, wherein one of the switches conducts the carrier signal in response to a first state of the digital phase control signal and the other one of the switches conducts the phase-shifted carrier signal in response to a second state of the digital phase control signal.

4. The space-time digital power amplifier of claim 1 wherein each transmitter module is a member of a group of transmitter modules and wherein each group of transmitter modules comprises at least one transmitter module having a common amplification and receiving a common carrier signal, a common digital phase control signal and a common digital amplifier control signal.

5. The space-time digital power amplifier of claim 4 wherein each group of transmitter modules has a group amplification that differs from the group amplifications of the other groups of transmitter modules by a power of two.

6. The space-time digital power amplifier of claim 1 further comprising a processor in communication with the array of transmitter modules, the processor configured to receive a baseband data signal and to generate the digital phase control signals and digital power amplifier signals in response thereto.

7. The space-time digital power amplifier of claim 1 wherein the control circuits are fabricated in a single integrated circuit device.

8. The space-time digital power amplifier of claim 1 wherein the digital power amplifier provides a voltage amplification.

9. The space-time digital power amplifier of claim 1 wherein the digital power amplifier provides a current amplification.

10. A space-time digital power amplifier, comprising:
an array of transmitter modules, each of the transmitter modules comprising:
a digital power amplifier having a first input, a second input and an output, and configured for generating a signal having an amplification at the output in response to an active state of a digital amplifier control signal received at the first input;
a transmit antenna in communication with the output of the digital power amplifier and configured to transmit an RF signal responsive to the signal at the output of the digital power amplifier; and
a control circuit having a first output in communication with the first input of the digital power amplifier and a second output in communication with the second input of the digital power amplifier, the control circuit configured to receive a digital phase control signal, a carrier signal and a phase-shifted carrier signal, the control circuit providing one of the carrier signal and the phase-shifted carrier signal to the second input of the digital power amplifier in response to a state of the digital phase control signal, wherein the carrier signal and the phase-shifted carrier signal are in-phase carrier signals for a first subset of the transmitter modules and are quadrature carrier signals for a second subset of the transmitter modules and wherein the amplification of the signal at the output of the digital power amplifier is responsive to the digital amplifier control signal received at the first input of the digital power amplifier,
wherein the RF signals propagating from the transmit antennas are spatially-combined to generate a communications signal having a waveform responsive to the digital amplifier control signals and the digital phase control signals.

* * * * *